(12) United States Patent
Shakya et al.

(10) Patent No.: US 11,486,923 B2
(45) Date of Patent: Nov. 1, 2022

(54) APPARATUSES AND METHODS FOR MITIGATING STICKING OF UNITS-UNDER-TEST

(71) Applicant: Intel Corporation, Santa Clara, CA (US)

(72) Inventors: Jagat Shakya, Hillsboro, OR (US); Ethan Caughey, Portland, OR (US); Jeremy Alan Streifer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 16/210,259

(22) Filed: Dec. 5, 2018

(65) Prior Publication Data

US 2020/0182928 A1    Jun. 11, 2020

(51) Int. Cl.
| | | |
|---|---|---|
| *G01R 1/04* | (2006.01) | |
| *G01R 1/067* | (2006.01) | |
| *G01R 1/073* | (2006.01) | |
| *G01R 31/00* | (2006.01) | |
| *G01R 31/26* | (2020.01) | |
| *G01R 31/28* | (2006.01) | |

(52) U.S. Cl.
CPC ..... *G01R 31/2884* (2013.01); *G01R 1/06705* (2013.01); *G01R 31/2887* (2013.01); *G01R 31/2889* (2013.01)

(58) Field of Classification Search
CPC .......... G01R 1/04; G01R 1/067; G01R 1/073; G01R 31/00; G01R 31/02; G01R 31/26; G01R 31/28
See application file for complete search history.

(56) References Cited

U.S. PATENT DOCUMENTS

2004/0183556 A1* 9/2004 Wada ................. G01R 1/07314
29/842
2006/0186905 A1* 8/2006 Kohashi ............... G01R 1/0466
324/750.25

* cited by examiner

*Primary Examiner* — Neel D Shah
(74) *Attorney, Agent, or Firm* — Akona IP PC

(57) ABSTRACT

Disclosed herein are apparatuses and methods for mitigating sticking of units-under-test (UUTs). For example, in some embodiments, a probe card may include a probe landing pad, a guide plate having a hole therein, and a pushing mechanism. The pushing mechanism may include a pusher needle and a pusher needle support, the pusher needle support may be between the probe landing pad and the guide plate, and the pusher needle support may be controllable to cause the pusher needle to extend and retract through the hole in the guide plate.

23 Claims, 9 Drawing Sheets

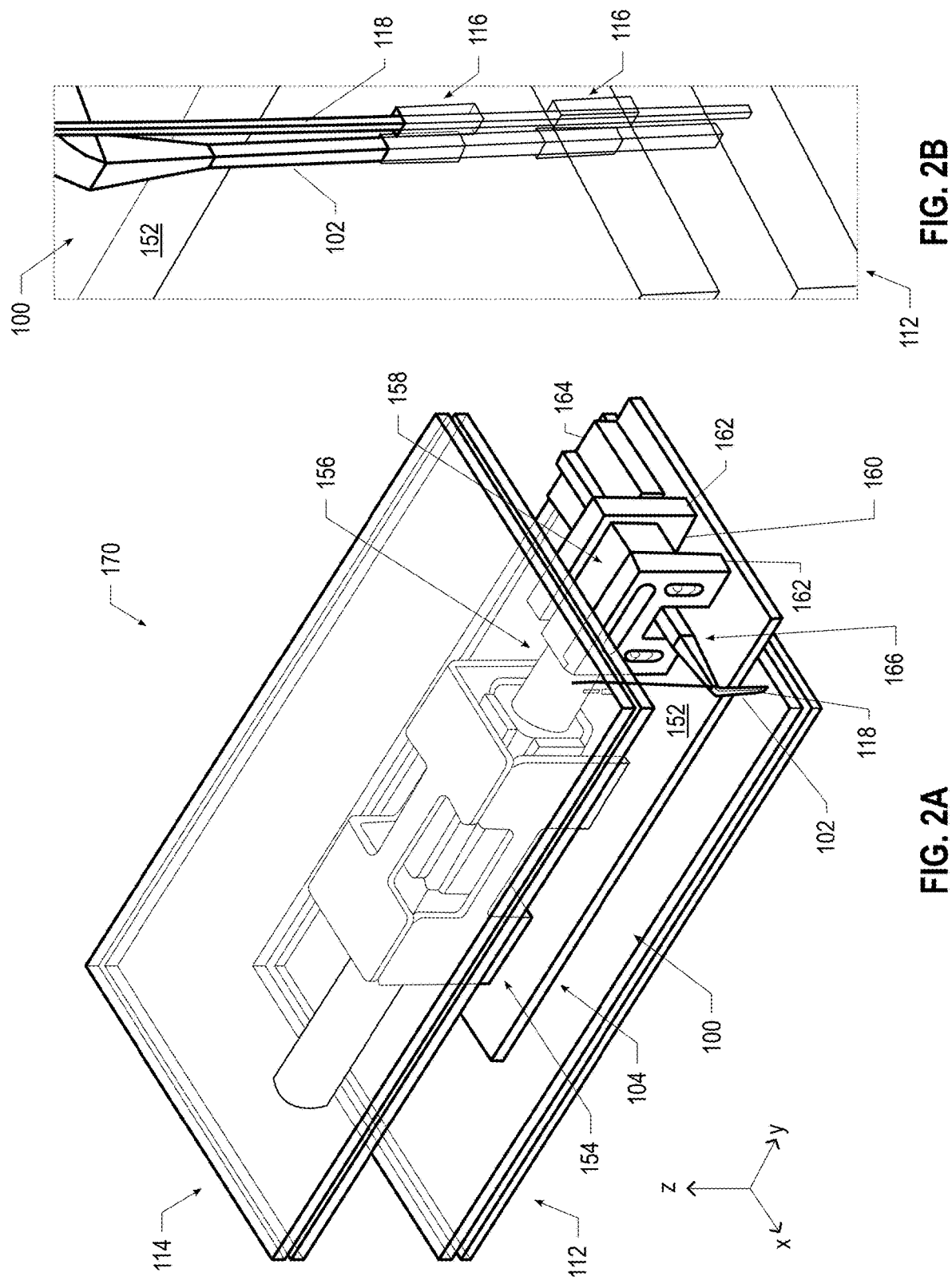

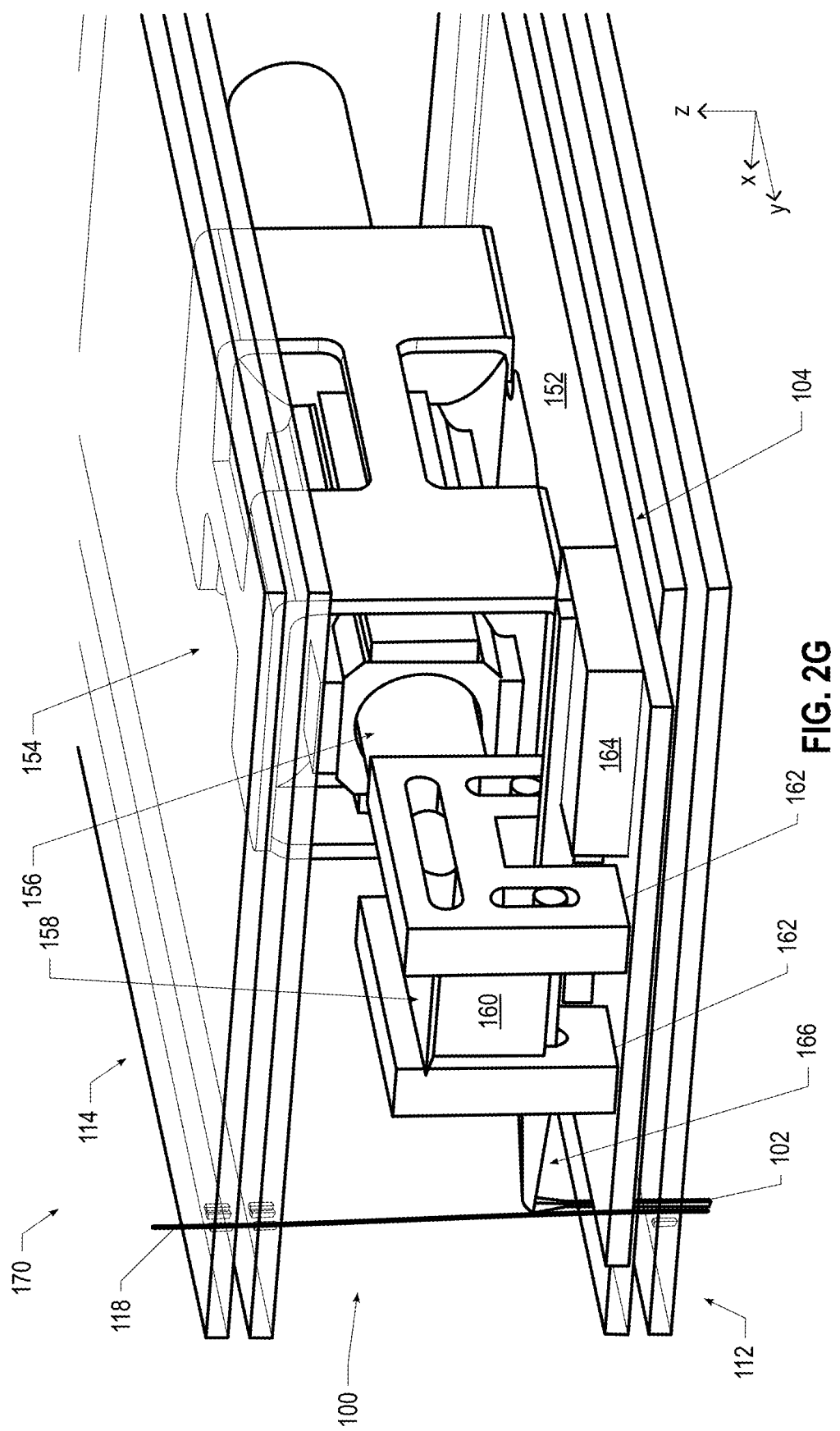

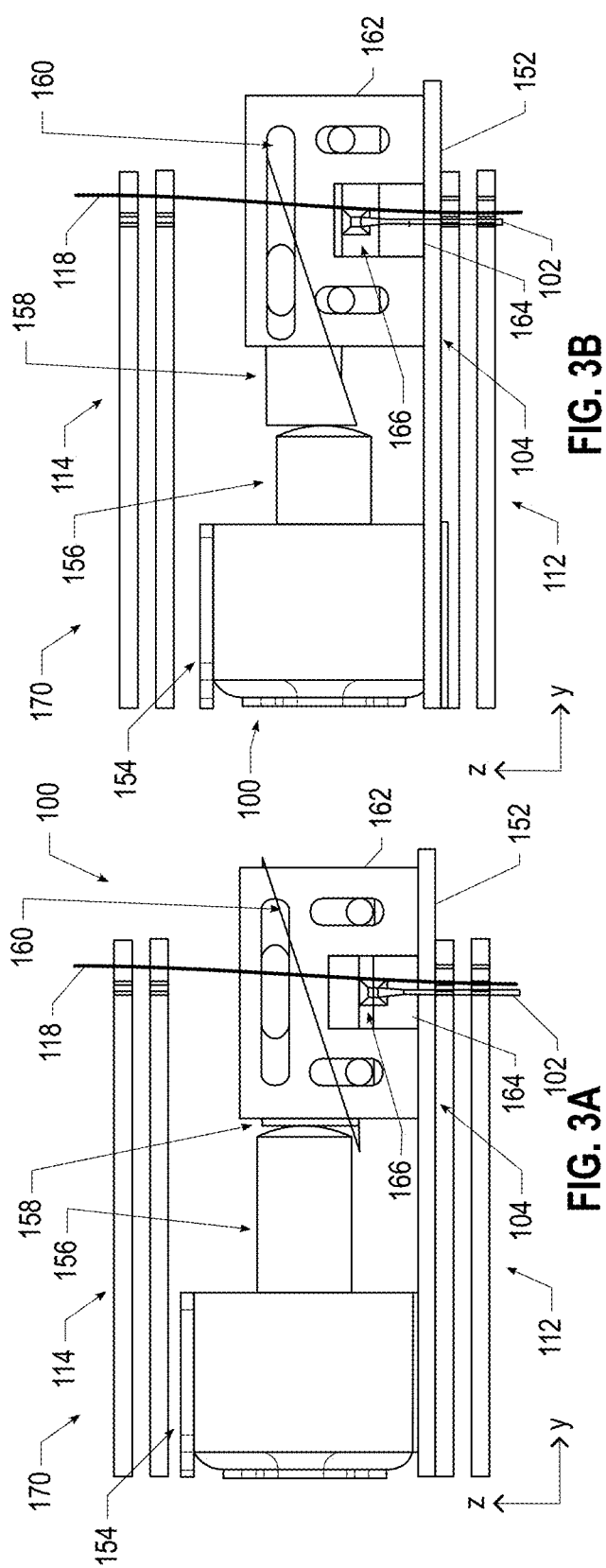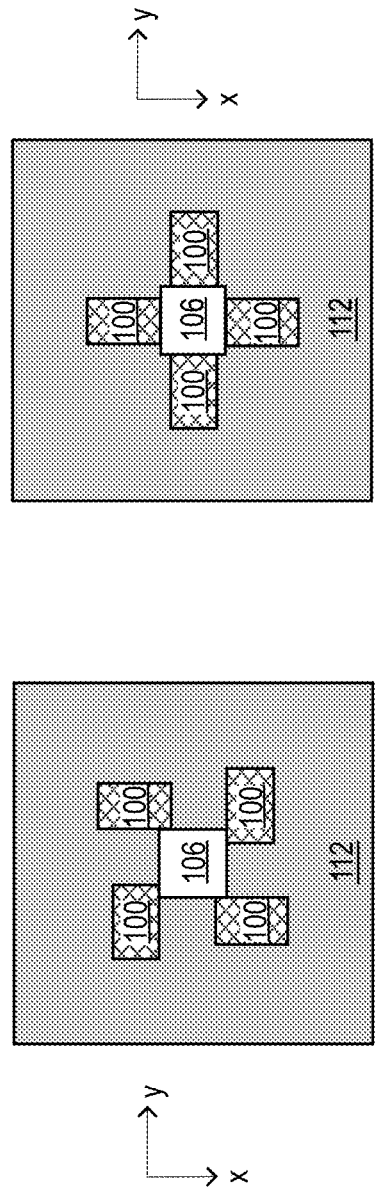

APPARATUSES AND METHODS FOR MITIGATING STICKING OF UNITS-UNDER-TEST

BACKGROUND

Electronic components, such as integrated circuit (IC) devices, may be tested before they are assembled into larger devices. During testing, conductive probes may be brought into conductive contact with the electronic components, and the performance of the electronic components may be tested via these conductive probes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 2A-2G are various views of a portion of a guide plate apparatus that may be included in the probe card of FIG. 1, in accordance with various embodiments.

FIGS. 3A-3B are side, cross-sectional views of different stages of operation of the guide plate apparatus of FIG. 2, in accordance with various embodiments.

FIGS. 4A-4B are top views of example arrangements of pushing mechanisms in the guide plate apparatuses of FIGS. 1 and 2, in accordance with various embodiments.

DETAILED DESCRIPTION

Disclosed herein are apparatuses and methods for mitigating sticking of units-under-test (UUTs). For example, in some embodiments, a probe card may include a probe landing pad, a guide plate having a hole therein, and a pushing mechanism. The pushing mechanism may include a pusher needle and a pusher needle support, the pusher needle support may be between the probe landing pad and the guide plate, and the pusher needle support may be controllable to cause the pusher needle to extend and retract through the hole in the guide plate.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "integrated circuit (IC) package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 2" may be used to refer to the collection of drawings of FIGS. 2A-2G, etc.

Figure 1A:
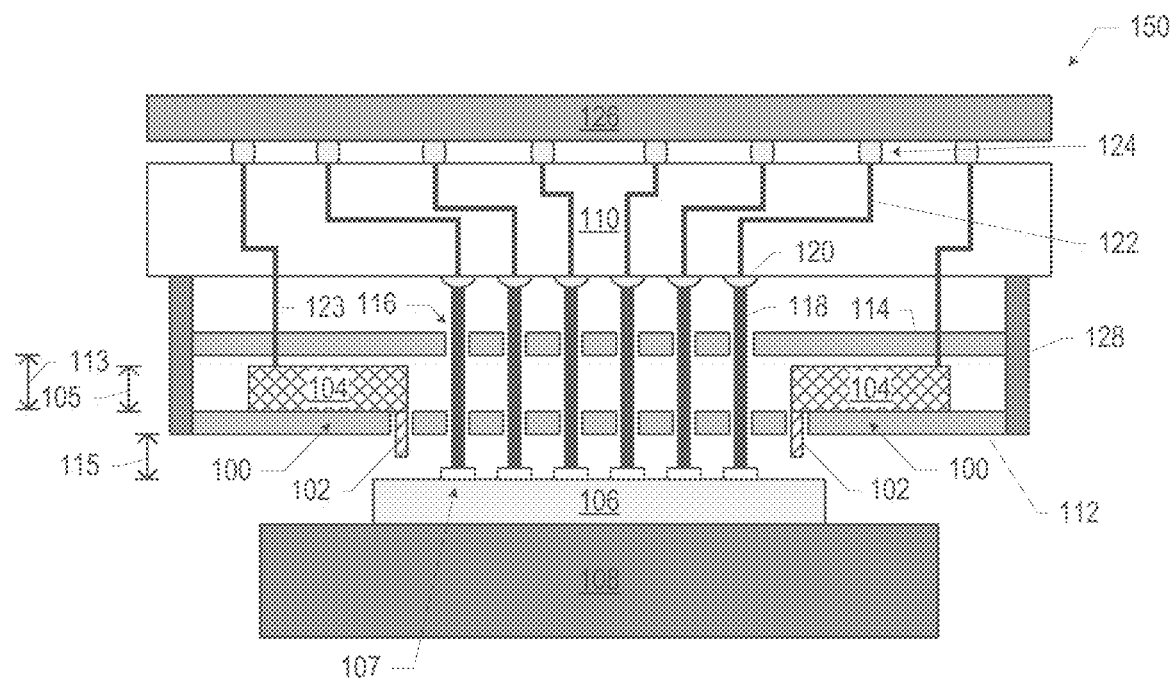
FIGS. 1A-1B are side, cross-sectional views of different stages of operation of a probe card, including a guide plate apparatus with a pushing mechanism, during testing of a unit-under-test (UUT), in accordance with various embodiments.
Figure 1B:
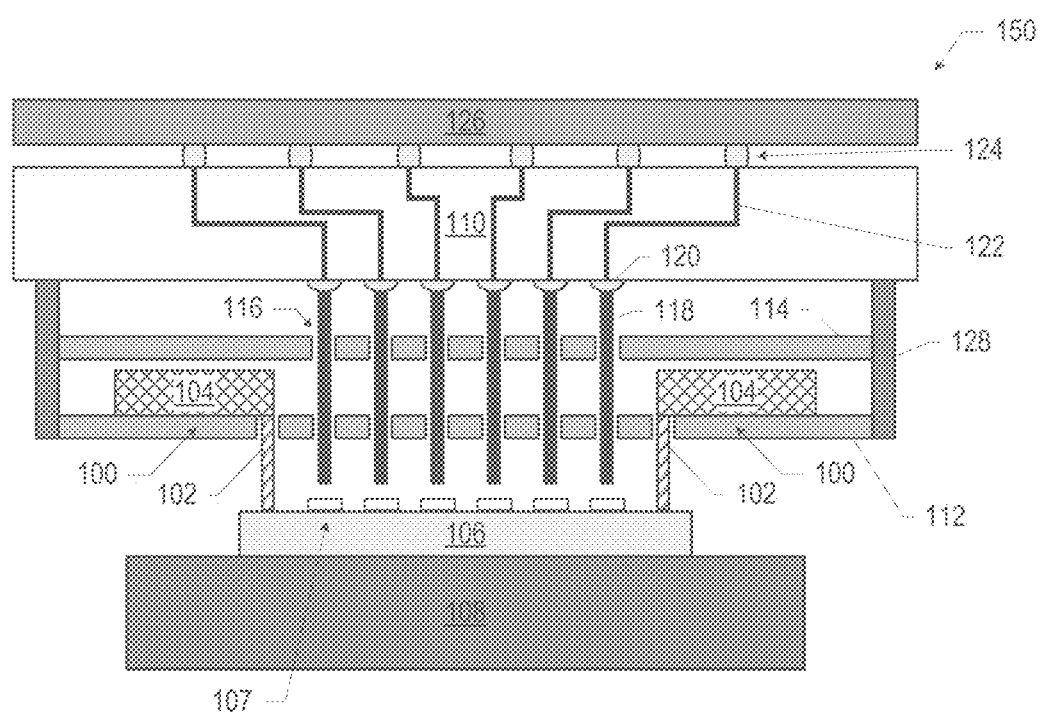
Figure 2C:
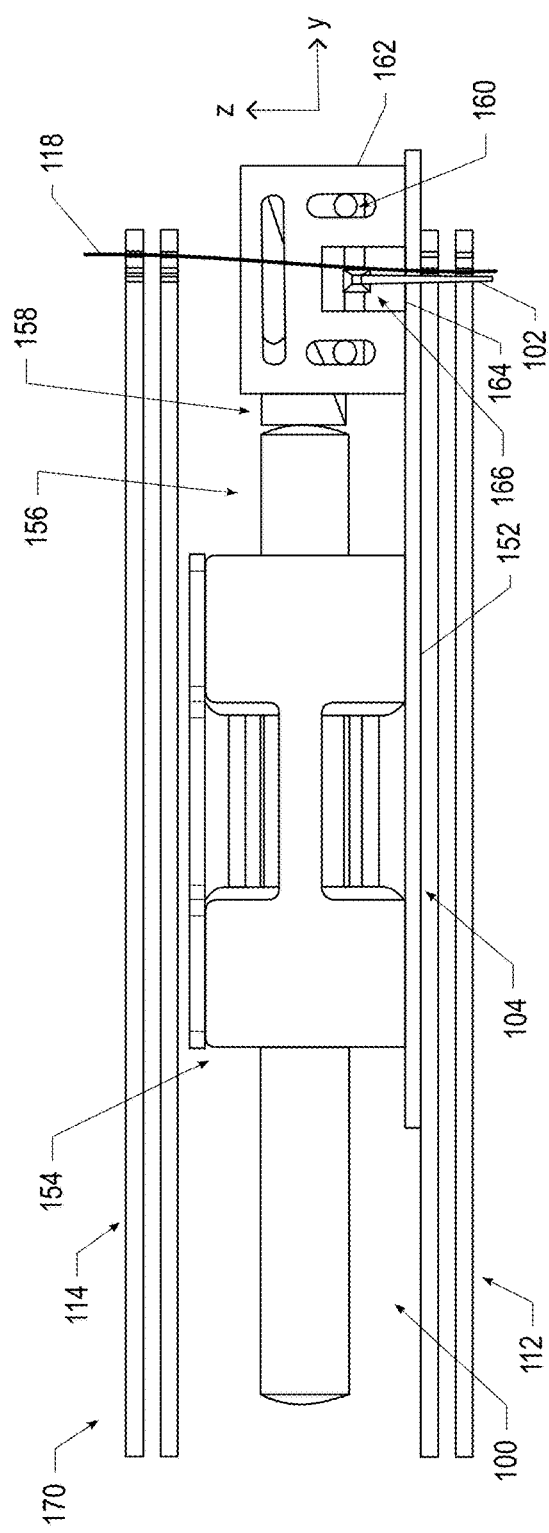
Figure 2E:
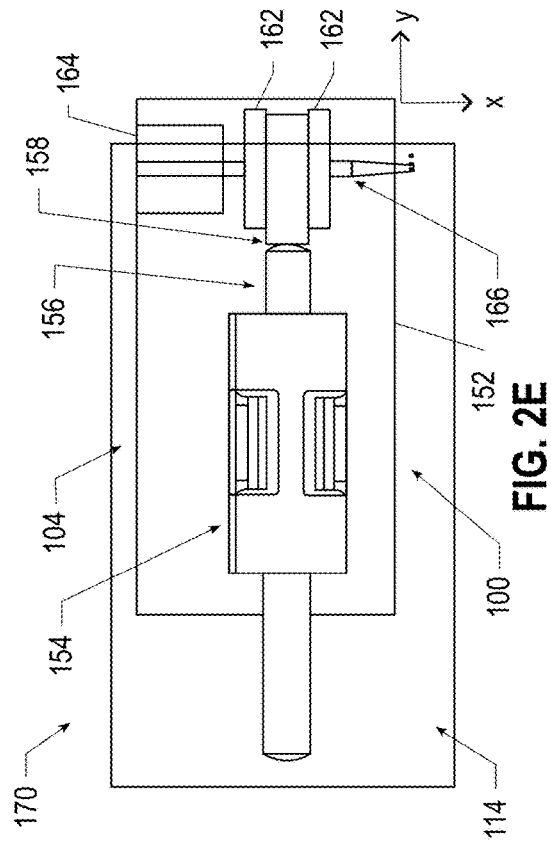
Figure 2D:
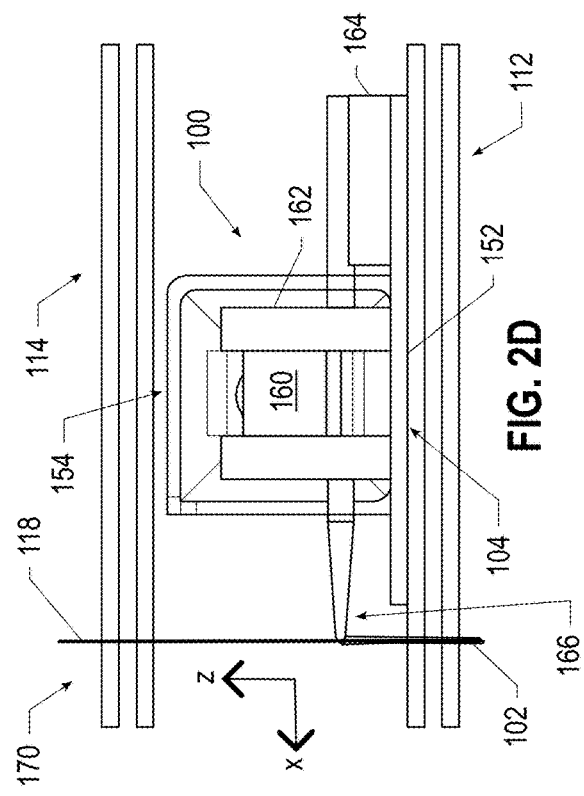
Figure 2F:
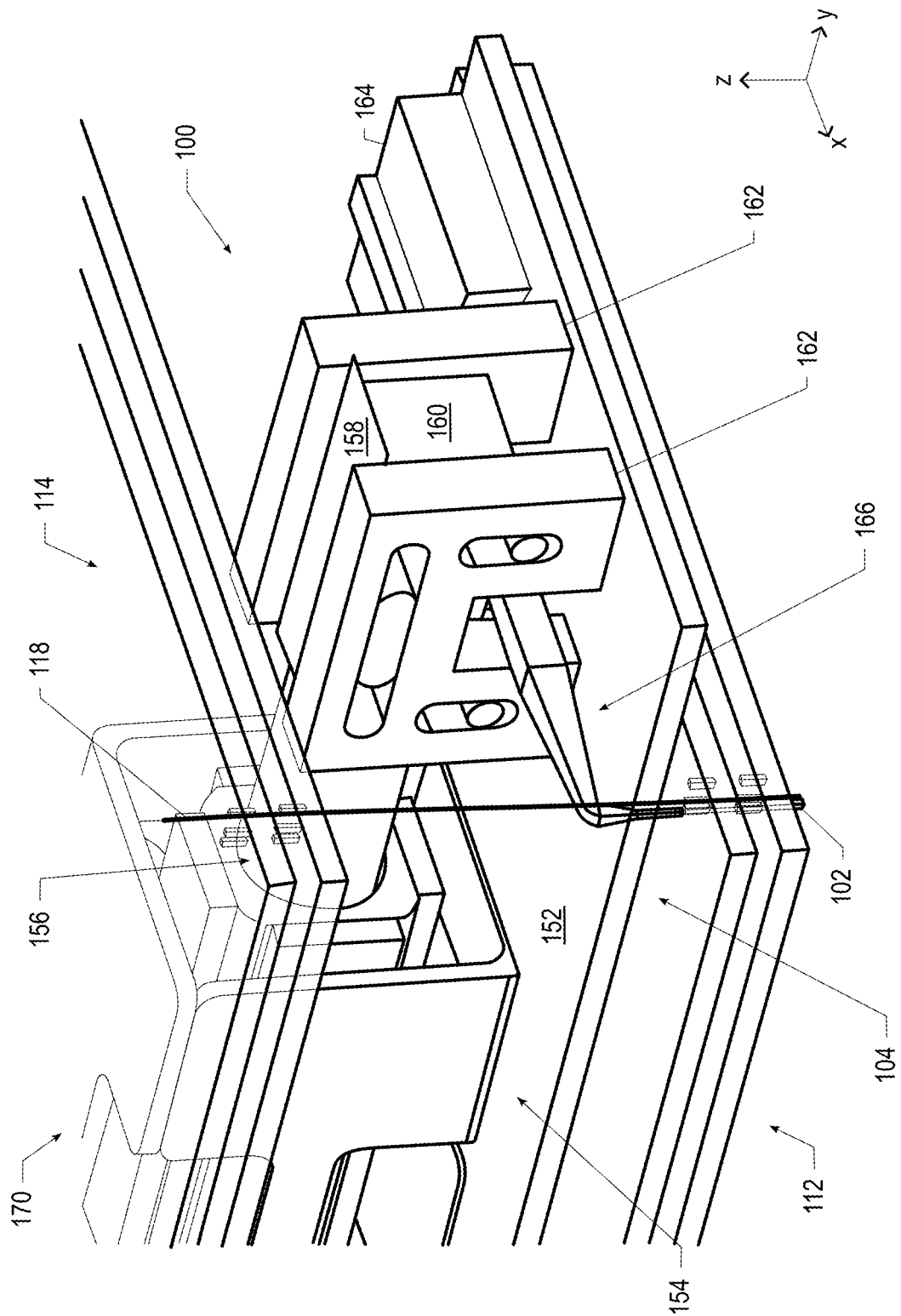

FIGS. 1A-1B are side, cross-sectional views of different stages of operation of a probe card 150, including a guide plate apparatus 170 with a pushing mechanism 100, during testing of a UUT 106, in accordance with various embodiments. The UUT 106 may be any suitable electronic component. For example, in some embodiments, the UUT 106 may be a single die (e.g., any of the dies 1502 discussed below with reference to FIG. 6), or an array of multiple dies. In some embodiments, the UUT 106 may be a wafer (e.g., any of the wafers 1500 discussed below with reference to FIG. 6). The UUT 106 may be held down against a thermal chuck 108 by vacuum force. The thermal chuck 108 may provide mechanical support to the UUT 106 during testing and may also serve to dissipate heat generated by the UUT 106 during testing. The top surface of the UUT 106 may include one or more conductive contacts 107 through which electrical testing may occur. In some embodiments, the conductive contacts 107 may include solder (e.g., solder microbumps).

The probe card 150 may include a guide plate apparatus 170 coupled to a probe landing pad 110. The probe landing pad 110 may include conductive contacts 120 at one face, and these conductive contacts 120 may be in electrical communication with multiple electrical pathways 122 through the probe landing pad 110. In some embodiments, the conductive contacts 120 may include conductive bumps having a metallic coating (e.g., a coating of nickel and/or gold). Solder interconnects 124 may electrically couple the electrical pathways 122 to a circuit board 126 at the opposite face of the probe landing pad 110. The pitch of these electrical pathways 122 at the face at which they make electrical contact with the conductive contacts 120 may be finer than the pitch of the electrical pathways 122 at the opposite face of the probe landing pad 110 (proximate to the circuit board 126); the probe landing pad 110 may thus act as a space transformer.

The guide plate apparatus 170 may include one or more guide plates 112/114 having holes 116 through which probe bodies 118 extend. Two guide plates, a lower guide plate 112 and an upper guide plate 114, are illustrated in FIG. 1, but a probe card 150 may include more or fewer guide plates. For example, in some embodiments, a guide plate apparatus 170 may include a lower guide plate 112 (on which a pushing mechanism 100 is disposed, as discussed further below) but no upper guide plate 114. The probe bodies 118 may be in electrical contact with the conductive contacts 120 of the probe landing pad 110, and during testing, the probe bodies 118 may be in electrical contact with the conductive contacts 107 of the UUT 106. More generally, during testing, the circuit board 126 may control and/or monitor electrical signals sent to and/or from the UUT 106 through the electrical pathways 122, the conductive contacts 120, and the probe bodies 118. The guide plates 112/114 may be held in position by a guide plate support 128 that extends around the periphery of the guide plate apparatus 170. In some embodiments, the guide plate support 128 may include one or more screws that extend through the guide plates 112/114 and secure the guide plates 112/114 to the probe landing pad 110. The probe bodies 118 may have any suitable dimensions. For example, in some embodiments, the probe bodies 118 may have a length between 3 millimeters and 7 millimeters (e.g., between 4 millimeters and 7 millimeters) in some embodiments, the probe bodies 118 may have a diameter between 30 microns and 70 microns (e.g., between 40 microns and 60 microns).

Although the lower guide plate 112 and the upper guide plate 114 are referred to herein in the singular, the lower guide plate 112 and/or the upper guide plate 114 may each include multiple guide plates. For example, the guide plate apparatus 170 illustrated in FIG. 2 has a lower guide plate 112 that includes two different guide plates, as well as an upper guide plate 114 that includes two different guide plates. Although FIG. 1 illustrates the holes 116 in the upper guide plate 114 as aligned with the holes 116 in the lower guide plate 112, this need not be the case; the holes 116 in the guide plates of a guide plate apparatus 170 may be aligned in any desired manner with respect to each other to allow the probe bodies 118 to pass through.

A pushing mechanism 100 may be disposed between the lower guide plate 112 and the probe landing pad 110. In the embodiment of FIG. 1 (and FIG. 2, discussed below), the pushing mechanism 100 is disposed between the lower guide plate 112 and the upper guide plate 114. The pushing mechanism 100 may include a pusher needle 102 and a pusher needle support 104. The pusher needle support 104 may be coupled to the pusher needle 102, and may be controllable to cause the pusher needle 102 to extend and retract through a corresponding hole 116 in the lower guide plate 112. Just as the probe bodies 118 are positioned with high accuracy on the UUT 106 by the corresponding holes 116 in the guide plates 112/114, the pusher needle 102 may be positioned with high accuracy on the UUT by the corresponding hole 116 in the lower guide plate 112. In some embodiments, the pusher needle support 104 may be controlled by electrical signals provided to the pusher needle support 104 from the circuit board 126 and through one or more electrical pathways 122 and electrical cabling 123. The pusher needle support 104 may cause the pusher needle 102 to extend and retract using any desired technique; FIG. 2 illustrates a particular example of a pusher needle support 104 in detail. The pusher needle 102 may have any suitable dimensions; for example, the pusher needle 102 may have a diameter between 30 microns and 70 microns (e.g., between 40 microns and 60 microns). In some embodiments, a pusher needle 102 may have a square cross-section (e.g., a square tip). In some embodiments, a cross-sectional area of a pusher needle 102 may be less than 2500 square microns. FIG. 1 illustrates two pushing mechanisms 100 included in a probe card 150, but a probe card 150 may include any desired number of pushing mechanisms 100 arranged in any desired pattern (e.g., as discussed below with reference to FIG. 4).

The pushing mechanisms 100 disclosed herein may mitigate sticking between the UUT 106 and the probe card 150 by providing a mechanical force to help disengage the probe card 150 from the UUT 106 when a testing sequence is complete. In particular, during electrical testing, one or more of the probe bodies 118 may become inadvertently "stuck" to the UUT 106. This may occur in any of a number of ways: a probe body 118 may slip between adjacent ones of the conductive contacts 107 and become "wedged" there, or a conductive contact 107 may become deformed due to the heat generated during testing and may become mechanically attached to a probe body 118. Further, the vacuum force between the UUT 106 and the thermal chuck 108 is typically not adequate to overcome this sticking, and is not readily increased due to the limited surface area of the UUT 106. In conventional testing assemblies, the sticking may result not only in damage to or loss of the UUT, but also damage to or loss of the expensive probe card, as well as significant delay in the manufacturing and testing process. The probe cards 150 disclosed herein may mitigate these losses by "pushing" against the UUT 106 after a testing sequence in order to provide an appropriate force to counter any undesirable sticking and gently disengage the UUT 106 from the probe card 150.

As noted above, FIGS. 1A and 1B illustrate different stages of operation of a probe card 150 during testing of the UUT 106. In particular, FIG. 1A illustrates a stage in which the probe bodies 118 are in electrical contact with the conductive contacts 107 of the UUT 106. Electrical testing may occur during this stage. In FIG. 1A, the pusher needles 102 are spaced away from the surface of the UUT 106, and thus are not in contact during electrical testing. In other embodiments of the probe cards 150 disclosed herein, the pusher needles 102 may be in contact with the surface of the UUT 106 during electrical testing.

FIG. 1B illustrates a stage after completion of an electrical testing sequence. In this stage, the probe card 150 has been moved away (e.g., vertically) from the UUT 106 to space the probe bodies 118 away from the conductive contacts 107. The pusher needles 102, however, have been extended to make contact with and apply force to the UUT 106 to aid in separation between the probe bodies 118 and the conductive contacts 107 of the UUT 106. The amount of force applied by the pusher needles 102 on the UUT 106 may be controlled by the pusher needle support 104 (e.g., by controlling the rate at which the pusher needles 102 extend, as well as other parameters). After the probe card 150 and the UUT 106 have been successfully separated, the pusher needle support 104 may again retract the pusher needles 102 by some amount.

The height 105 of the pusher needle support 104 may be constrained by the available space in the guide plate apparatus 170. For example, in some embodiments, the height 105 may be less than 4 millimeters (e.g., less than 3 millimeters). In some embodiments, the distance 113 between the lower guide plate 112 and the upper guide plate 114 may be between 3 millimeters and 4 millimeters. In some embodiments, the probe bodies 118 may extend past the bottom surface of the lower guide plate 112 by a distance 115 that is less than 500 microns.

FIGS. 2A-2G are various views of a portion of a guide plate apparatus 170 that may be included in the probe card 150 of FIG. 1, in accordance with various embodiments. As noted above, the guide plate apparatus 170 illustrated in FIG. 2 includes two guide plates in each of the upper guide plate 114 and the lower guide plate 112; a probe body 118 extends through holes 116 in all of these guide plates.

The pusher needle support 104 of FIG. 2 is disposed between the lower guide plate 112 and the upper guide plate 114. The pusher needle support 104 includes a base plate 152 on which a motor 154 is disposed (and secured, e.g., via an adhesive). The base plate 152 may be secured to the lower guide plate 112 (e.g., by an adhesive) and in some embodiments, may be formed of a same or similar material as the lower guide plate 112 to minimize the potential for cracking or other mechanical problems due to the base plate 152 and the lower guide plate 112 having different coefficients of thermal expansion. In some embodiments, the base plate 152 may be formed of a ceramic material. The base plate 152 may have any suitable dimensions. For example, in some embodiments, the base plate 152 may have a thickness (i.e., in the Z-direction) of 200 microns, and an area that is less than 100 square millimeters (e.g., 6 millimeters by 15 millimeters) The motor 154 may be a linear motor that, when actuated (e.g., by an applied voltage), causes an arm 156 to move forward and backward in the Y-direction. For ease of illustration, FIG. 2 omits the electrical cabling 123, but such cabling 123 they make an electrical connection with the motor 154. In some embodiments, the motor 154 may be a piezoelectric motor. The height of the motor 154 (i.e., in the Z-direction) may be 4 millimeters or less (e.g., less than 3 millimeters). In some embodiments, the motor 154 may permit a travel range for the arm 156 of up to 6 millimeters.

The pusher needle support 104 of FIG. 2 may also include a cantilever support 164 disposed on the base plate 152 (and secured to the base plate 152 via, e.g., an adhesive) and a cantilever 166 extending from the cantilever support 164, as shown. In some embodiments, the cantilever 166 may be partially embedded in the cantilever support 164, or otherwise mechanically secured to the cantilever support 164. The pusher needle 102 may be attached to a tip of the cantilever 166. In some embodiments, the pusher needle 102 and the cantilever 166 may be separately fabricated and then attached, while in other embodiments, the pusher needle 102 and the cantilever 166 may be fabricated together as a single unit. As illustrated in FIG. 2, the cantilever 166 may be oriented in the X-direction, while the arm 156 of the motor 154 may be oriented in the Y-direction (perpendicular to the orientation of the cantilever 166). The cantilever 166 may have any suitable stiffness to provide a desired spring force (e.g., as discussed below). For example, in some embodiments, the cantilever 166 may have a stiffness greater than 1 gram per micron. The cantilever 166 may have any suitable length. For example, in some embodiments, the cantilever 166 may have a length between 4 millimeters and 10 millimeters (e.g., between 5 millimeters and 7 millimeters).

The pusher needle support 104 of FIG. 2 may also include a double wedge structure, including an upper wedge 158 in a lower wedge 160, supported by a pair of wedge frames 162 attached to the base plate 152 (e.g., by adhesive). The upper wedge 158 may include projections that extend into horizontal slots in the wedge frames 162, and the mechanical coupling between the projections and the slots may constrain the upper wedge 158 to translate only in the Y-direction. Similarly, the lower wedge 160 may include projections that extend into vertical slots in the wedge frames 162, and the mechanical coupling between the projections in the slots may constrain the lower wedge 160 to translate only in the Z-direction. The angled faces of the upper wedge 158 and the lower wedge 160 may be in contact, and the arm 156 may be in contact with the proximate "side" face of the upper wedge 158, as shown. Further, the cantilever 166 may be in contact with the proximate "bottom" face of the lower wedge 160, as shown, and may provide an upward spring force to the lower wedge 160.

The exposed surface of some UUTs 106 may be covered almost entirely with conductive contacts 107, and thus there may be limited surface area available on which a pusher needle 102 may land. For example, in some embodiments, the distance between the probe body 118 and an adjacent pusher needle 102 may be less than 100 microns. In some arrangements, a pusher needle 102 may land on a corner of a UUT 106, and/or in a scribe street along an edge of the UUT 106.

FIG. 3 illustrates different stages of operation of the pushing mechanism 100 of FIG. 2; in particular, FIG. 3A illustrates extension of the pusher needle 102, while FIG. 3B illustrates retraction of the pusher needle 102. As shown in FIG. 3A, to extend the pusher needle 102, electrical signals provided to the motor 154 (e.g., from the circuit board 126 through the cabling 123, not shown) cause the motor 154 to drive the arm 156 in the positive Y-direction. The arm 156 makes contact with the upper wedge 158, pushing the upper wedge 158 in the positive Y-direction, and in turn, pushing the lower wedge 160 in the negative Z-direction. The double wedge structure may thus "translate" force and motion in the Y-direction into force and motion in the Z-direction. The movement of the lower wedge 160 in the negative Z-direction may push the cantilever 166 in the negative Z-direction, moving the pusher needle 102 in the negative Z-direction (toward a UUT 106, not shown). Thus, as illustrated in FIG. 3A, the pusher needle support 104 may cause the pusher needle 102 to extend. FIG. 3B illustrates retraction of the pusher needle 102; to retract the pusher needle 102, electrical signals provided to the motor 154 may cause the motor 154 to drive the arm 156 in the negative Y-direction, away from the upper wedge 158. The upward spring force provided by the cantilever 166 may no longer be countered by the force from the arm 156/upper wedge 158, and thus the cantilever 166 may move in the positive Z-direction, lifting the pusher needle 102 and pushing the lower wedge 160 in the positive Z-direction.

As noted above, a probe card 150 may include any number of pushing mechanisms 100 arranged in any desired manner. For example, FIGS. 4A and 4B illustrate different arrangements of four pushing mechanisms 100 in a guide plate apparatus 170 above a rectangular UUT 106. In the arrangement of FIG. 4A, the pushing mechanisms 100 may be arranged so that a pusher needle 102 (not shown) of an individual pushing mechanism 100 is positioned to push on a corner of the UUT 106. In the arrangement of FIG. 4B, the pushing mechanisms 100 may be arranged so that a pusher needle 102 (not shown) of an individual pushing mechanism 100 is to push on a side edge of the UUT 106. Any other suitable number and arrangement of pushing mechanisms 100 may be included in a probe card 150.

Figure 5:
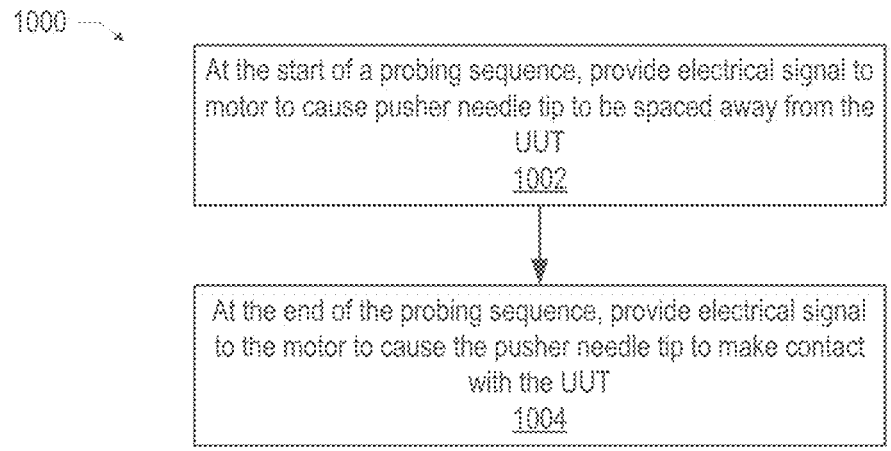
FIG. 5 is a flow diagram of a method of operating a probe card including a pushing mechanism, in accordance with various embodiments.

FIG. 5 is a flow diagram of a method 1000 of operating a probe card including a pushing mechanism, in accordance with various embodiments. Although the operations of the method 1000 may be illustrated with reference to particular embodiments of the probe card 150 and pushing mechanisms 100 disclosed herein, the method 1000 may be used to operate any suitable probe card including a pushing mechanism. Although various operations are illustrated once each and in a particular order in FIG. 5, the operations may be reordered and/or repeated as desired.

At 1002, at the start of a probing sequence, electrical signals may be provided to a motor to cause a pusher needle tip to be spaced away from a UUT. For example, a circuit board 126 may provide electrical signals to a motor 154 in a pusher needle support 104 and a guide plate apparatus 170 to cause a tip of a pusher needle 102 to be spaced away from a UUT 106 (e.g., as illustrated in FIG. 1A and FIG. 3B). The electrical signals may include a pre-set amount of voltage (e.g., a negative voltage) for a pre-set amount of time, based upon a calibration of the motor 154 and the amount of travel desired.

At 1004, at the end of the probing sequence, electrical signals may be provided to a motor to cause the pusher needle tip to make contact with the UUT. For example, the circuit board 126 to provide electrical signals to a motor 154 in a pusher needle support 104 and a guide plate apparatus 170 to cause a tip of the pusher needle 102 to make contact with the UUT 106 (e.g., as illustrated in FIG. 1B and FIG. 3A), and thereby help disengage the probe card 150 from the UUT 106 at the end of testing. The electrical signals may include a pre-set amount of voltage (e.g., a positive voltage) for a pre-set amount of time, based upon a calibration of the motor 154 and the amount of travel desired.

The apparatuses and methods disclosed herein may be used during the probing of any suitable electronic component. FIGS. 6-10 illustrate various examples of apparatuses that may be or may include electronic components probed using any of the apparatuses and methods disclosed herein.

Figure 6:
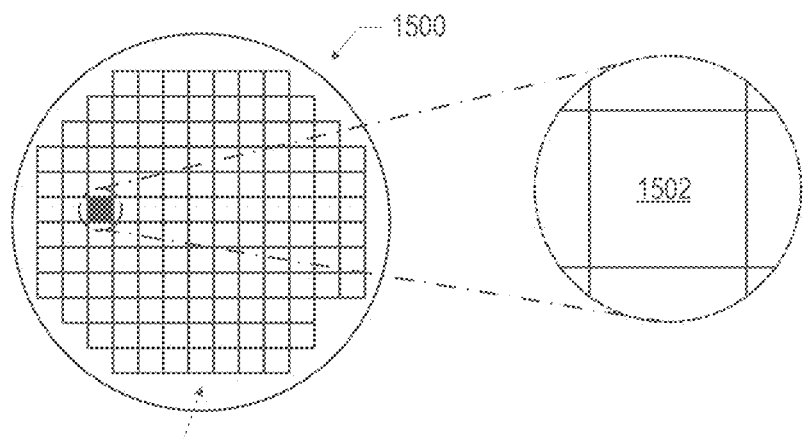
FIG. 6 is a top view of a wafer and dies that may be probed in accordance with any of the apparatuses or methods disclosed herein.

FIG. 6 is a top view of a wafer 1500 and dies 1502 that may be or may include electronic components probed using any of the apparatuses and methods disclosed herein. For example, in some embodiments, a wafer 1500 may be the UUT 106. In other embodiments, a die 1502 may be the UUT 106. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 7, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 7:
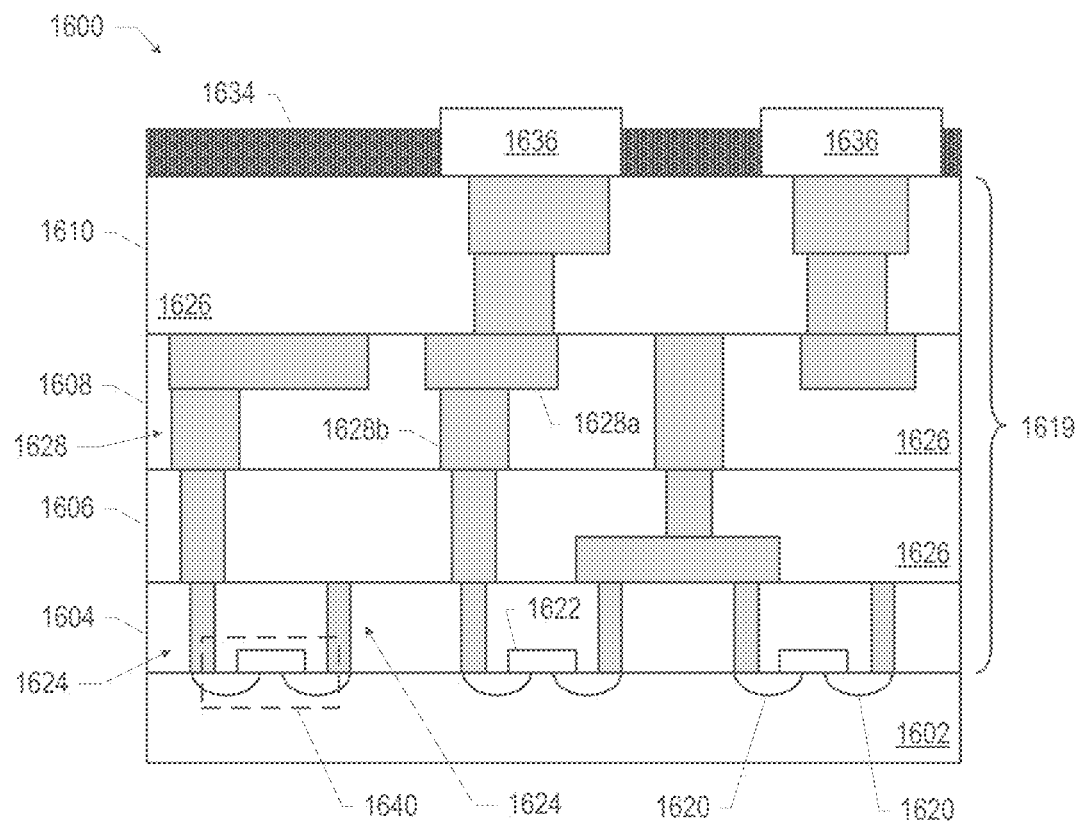
FIG. 7 is a side, cross-sectional view of an integrated circuit (IC) device that may be included in an electronic component probed in accordance with any of the apparatuses or methods disclosed herein.

FIG. 7 is a side, cross-sectional view of an IC device 1600 that may be included in one or more dies 1502 (FIG. 6). The IC device 1600 may be formed on a substrate 1602 (e.g., the wafer 1500 of FIG. 6) and may be included in a die (e.g., the die 1502 of FIG. 6). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 6) or a wafer (e.g., the wafer 1500 of FIG. 6).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 7 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 7 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 7). Although a particular number of interconnect layers 1606-1610 is depicted in FIG. 7, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 7. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 7. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 7, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 8:
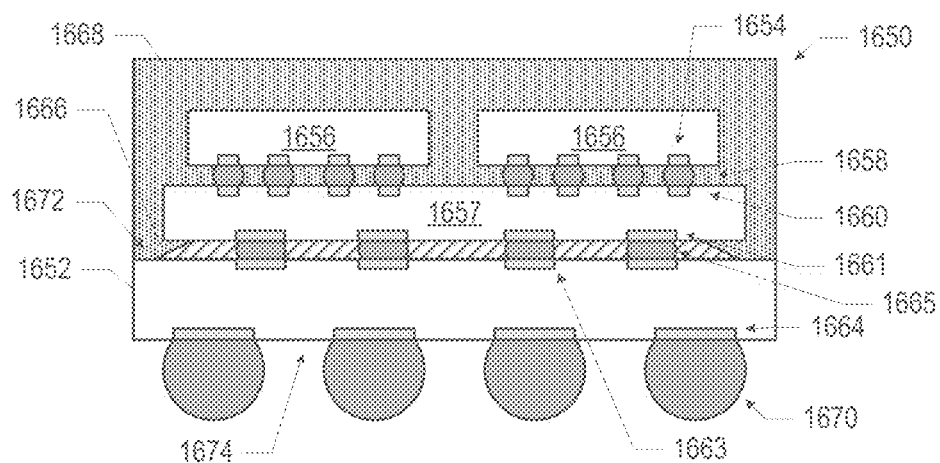
FIG. 8 is a side, cross-sectional view of an IC package that may include one or more electronic components probed in accordance with any of the apparatuses or methods disclosed herein.

FIG. 8 is a side, cross-sectional view of an example IC package 1650 that may include one or more electronic components probed in accordance with the apparatuses and methods disclosed herein. For example, the IC package 1650 may include some or all of an electronic component probed as the UUT 106. In some embodiments, the IC package 1650 may be a system-in-package (SiP).

The package substrate 1652 may be formed of a dielectric material (e.g., a ceramic, a buildup film, an epoxy film having filler particles therein, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 7.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 8 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 8 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 8 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 9.

The dies 1656 may take the form of any of the embodiments of the die 1502 discussed herein (e.g., may include any of the embodiments of the IC device 1600). For example, any of the dies 1656 may serve as the UUT 106 and may be probed in accordance with any of the embodiments disclosed herein. In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 8 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 8, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer

1657. More generally, an IC package 1650 may include any other active or passive components known in the art.

Figure 9:
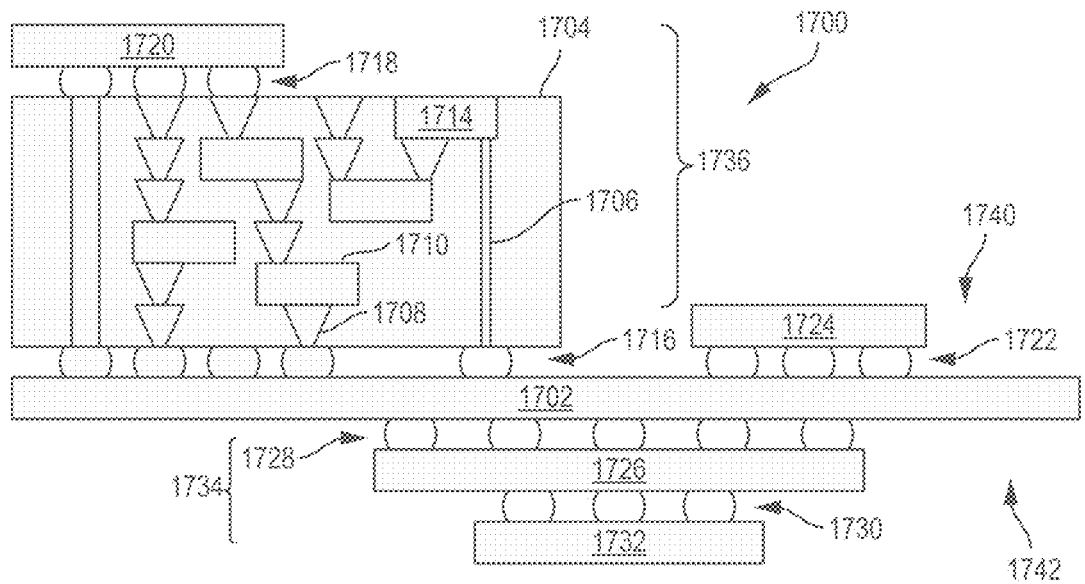
FIG. 9 is a side, cross-sectional view of an IC device assembly that may include one or more electronic components probed in accordance with any of the apparatuses or methods disclosed herein.

FIG. 9 is a side, cross-sectional view of an IC device assembly 1700 that may include one or more IC packages or other electronic components (e.g., a die) probed in accordance with any of the apparatuses or methods disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 8.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 6), an IC device (e.g., the IC device 1600 of FIG. 7), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
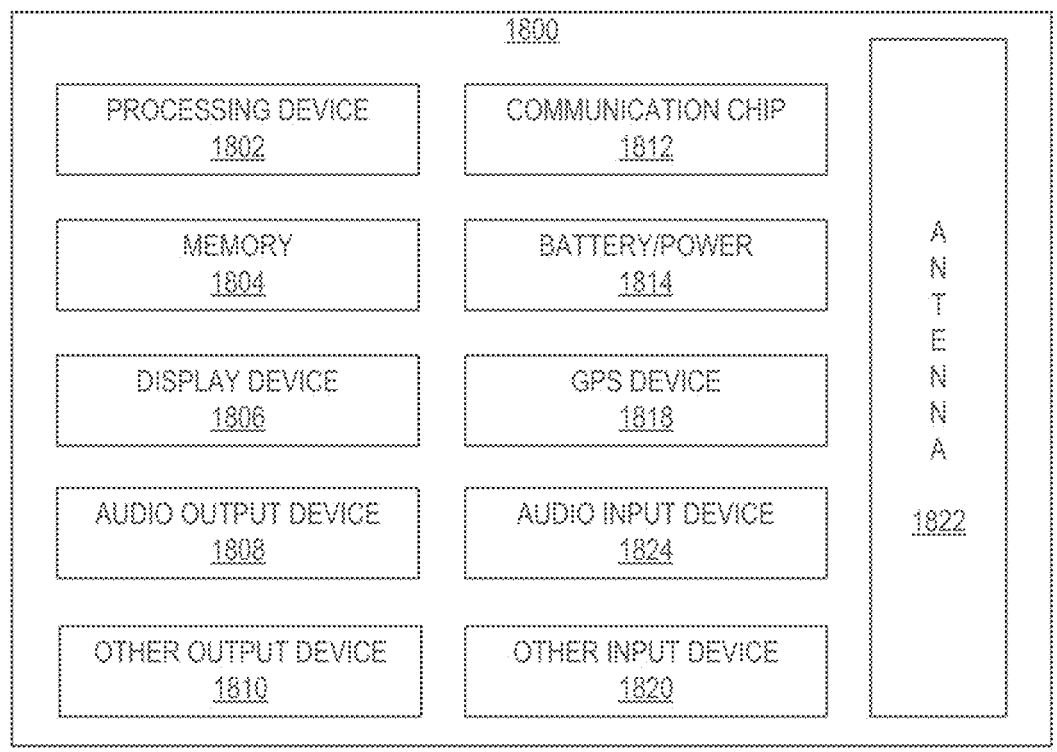
FIG. 10 is a block diagram of an example electrical device that may include one or more electronic components probed in accordance with any of the apparatuses or methods disclosed herein.

FIG. 10 is a block diagram of an example electrical device 1800 that may include one or more electronic components probed in accordance with any of the apparatuses or methods disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a probe card, including: a probe landing pad; a guide plate having a hole therein; and a pushing mechanism, wherein the pushing mechanism includes a pusher needle and a pusher needle support, the pusher needle support is between the probe landing pad and the guide plate, and the pusher needle support is controllable to cause the pusher needle to extend and retract through the hole in the guide plate.

Example 2 includes the subject matter of Example 1, and further specifies that the guide plate is a first guide plate, the probe card further includes a second guide plate, and the pusher needle support is between the first guide plate and the second guide plate.

Example 3 includes the subject matter of Example 2, and further specifies that a distance between the first guide plate and the second guide plate is between 3 millimeters and 4 millimeters.

Example 4 includes the subject matter of Example 3, and further specifies that the probe card further includes a third guide plate between the second guide plate and the probe landing pad.

Example 5 includes the subject matter of Example 4, and further specifies that the probe card further includes a fourth guide plate, the first guide plate is between the fourth guide plate and the pusher needle support, and the pusher needle support is controllable to cause the pusher needle to extend and retract through a hole in the first guide plate and a hole in the fourth guide plate.

Example 6 includes the subject matter of Example 2, and further specifies that the probe card further includes a second guide plate, the first guide plate is between the second guide plate and the pusher needle support, and the pusher needle support is controllable to cause the pusher needle to extend and retract through a hole in the first guide plate and a hole in the second guide plate.

Example 7 includes the subject matter of any of Examples 1-6, and further specifies that the pusher needle support includes a motor that controllably extends and retracts an arm in a plane parallel to a plane of the guide plate.

Example 8 includes the subject matter of Example 7, and further specifies that the motor is a piezoelectric motor.

Example 9 includes the subject matter of any of Examples 7-8, and further specifies that the motor is a linear motor.

Example 10 includes the subject matter of any of Examples 7-9, and further specifies that the motor has a height that is less than 3 millimeters.

Example 11 includes the subject matter of any of Examples 7-10, and further specifies that the pusher needle support includes a double wedge structure such that pushing a first wedge of the double wedge structure with the arm in a direction parallel to the plane of the guide plate causes a second wedge of the double wedge structure to move in a direction perpendicular to the plane of the guide plate.

Example 12 includes the subject matter of Example 11, and further specifies that the pusher needle support includes a cantilever in contact with the double wedge structure such that the cantilever resists movement of the second wedge of the double wedge structure in the direction perpendicular to the plane of the guide plate.

Example 13 includes the subject matter of Example 12, and further specifies that the pusher needle is mounted on the cantilever.

Example 14 includes the subject matter of any of Examples 1-11, and further specifies that the pusher needle support includes a cantilever, and the pusher needle is mounted on the cantilever.

Example 15 includes the subject matter of any of Examples 1-10, and further specifies that the pusher needle support includes a double wedge structure.

Example 16 includes the subject matter of Example 15, and further specifies that the pusher needle support includes a wedge frame, a first wedge of the double wedge structure is constrained by the wedge frame to move in a direction parallel to the guide plate, and a second wedge of the double wedge structure is constrained by the wedge frame to move in a direction perpendicular to the guide plate.

Example 17 includes the subject matter of any of Examples 1-16, and further specifies that the pusher needle support includes a base plate, and the base plate is on the guide plate.

Example 18 includes the subject matter of Example 17, and further specifies that the base plate has a same material composition as the guide plate.

Example 19 includes the subject matter of any of Examples 1-18, and further specifies that the pusher needle has a cross-sectional area that is less than 2500 square microns.

Example 20 includes the subject matter of any of Examples 1-19, and further includes: one or more probe bodies to contact the probe landing pad and extend through corresponding holes in the guide plate.

Example 21 includes the subject matter of Example 20, and further specifies that the guide plate is a first guide plate, the probe card further includes a second guide plate, the pusher needle support is between the first guide plate and the second guide plate, and the one or more probe bodies extend through corresponding holes in the second guide plate.

Example 22 includes the subject matter of any of Examples 20-21, and further specifies that individual ones of the probe bodies have a cross-sectional area that is less than 2500 square microns.

Example 23 includes the subject matter of any of Examples 20-22, and further specifies that a spacing between an individual probe body and the pusher needle is less than 100 microns.

Example 24 includes the subject matter of any of Examples 20-23, and further specifies that individual ones of the probe bodies have a length between 4 millimeters and 7 millimeters.

Example 25 includes the subject matter of any of Examples 1-24, and further specifies that the probe landing pad includes a space transformer.

Example 26 includes the subject matter of any of Examples 1-25, and further includes: a circuit board electrically coupled to the probe landing pad.

Example 27 includes the subject matter of any of Examples 1-26, and further specifies that the guide plate includes a plurality of holes, the pushing mechanism is one of a plurality of pushing mechanisms, individual ones of the pushing mechanisms include a pusher needle and a pusher needle support, the pusher needle support of an individual pushing mechanism is between the probe landing pad and the guide plate, and the pusher needle support of an individual pushing mechanism is controllable to cause the pusher needle of that individual pushing mechanism to extend and retract through a hole in the guide plate.

Example 28 includes the subject matter of Example 27, and further specifies that the probe card includes four pushing mechanisms.

Example 29 is a method of manufacturing a probe card, including: providing a probe landing pad and a guide plate, wherein the guide plate has a hole therein; and providing a pushing mechanism between the probe landing pad and the guide plate, wherein the pushing mechanism includes a pusher needle and a pusher needle support, the pusher needle support is between the probe landing pad and the guide plate, and the pusher needle support is controllable to cause the pusher needle to extend and retract through the hole in the guide plate.

Example 30 includes the subject matter of Example 29, and further specifies that providing the pushing mechanism between the probe landing pad and the guide plate includes: fabricating the pushing mechanism; and after fabricating the pushing mechanism, attaching the pushing mechanism to the guide plate.

Example 31 includes the subject matter of Example 30, and further specifies that the pushing mechanism includes a motor coupled to a base plate, and attaching the pushing mechanism to the guide plate includes attaching the base plate to the guide plate.

Example 32 includes the subject matter of any of Examples 29-31, and further includes: electrically coupling the pushing mechanism to the probe landing pad.

Example 33 is a method of using a probe card during testing of a unit-under-test (UUT), including: bringing probe bodies of the probe card into electrical contact with conductive contacts of the UUT, wherein the probe bodies extend through holes in a guide plate; and after completion of a test sequence, causing a pusher needle to extend through a hole in the guide plate to contact the UUT as the probe card is moved away from the UUT.

Example 34 includes the subject matter of Example 33, and further includes: causing the pusher needle to retract through the hole in the guide plate to not contact the UUT while the probe bodies are in electrical contact with conductive contacts of the UUT.

Example 35 includes the subject matter of any of Examples 33-34, and further specifies that the UUT includes a die or a wafer.

Example 36 includes the subject matter of any of Examples 33-35, and further specifies that the pusher needle is one of a plurality of pusher needles caused to extend through a corresponding hole in the guide plate to contact the UUT as the probe card is moved away from the UUT.

Example 37 includes the subject matter of any of Examples 33-36, and further specifies that causing the pusher needle to extend through a hole includes causing a linear motor to move in a plane perpendicular to motion of the pusher needle.

Example 38 is a probe card, including: a probe landing pad; a guide plate having a hole therein; and a pusher needle that extends through the hole, wherein the pusher needle is not electrically coupled to the probe landing pad.

Example 39 includes the subject matter of Example 38, and further specifies that the pusher needle is part of a pushing mechanism, the pushing mechanism includes the pusher needle and a pusher needle support, the pusher needle support is between the probe landing pad and the guide plate, and the pusher needle support is controllable to cause the pusher needle to extend and retract through the hole in the guide plate.

Example 40 includes the subject matter of Example 39, and further specifies that the guide plate is a first guide plate, the probe card further includes a second guide plate, and the pusher needle support is between the first guide plate and the second guide plate.

Example 41 includes the subject matter of Example 40, and further specifies that a distance between the first guide plate and the second guide plate is between 3 millimeters and 4 millimeters.

Example 42 includes the subject matter of Example 41, and further specifies that the probe card further includes a third guide plate between the second guide plate and the probe landing pad.

Example 43 includes the subject matter of Example 42, and further specifies that the probe card further includes a fourth guide plate, the first guide plate is between the fourth guide plate and the pusher needle support, and the pusher needle support is controllable to cause the pusher needle to extend and retract through a hole in the first guide plate and a hole in the fourth guide plate.

Example 44 includes the subject matter of Example 40, and further specifies that the probe card further includes a second guide plate, the first guide plate is between the second guide plate and the pusher needle support, and the pusher needle support is controllable to cause the pusher needle to extend and retract through a hole in the first guide plate and a hole in the second guide plate.

Example 45 includes the subject matter of any of Examples 39-44, and further specifies that the pusher needle support includes a motor that controllably extends and retracts an arm in a plane parallel to a plane of the guide plate.

Example 46 includes the subject matter of Example 45, and further specifies that the motor is a piezoelectric motor.

Example 47 includes the subject matter of any of Examples 45-46, and further specifies that the motor is a linear motor.

Example 48 includes the subject matter of any of Examples 45-47, and further specifies that the motor has a height that is less than 3 millimeters.

Example 49 includes the subject matter of any of Examples 45-48, and further specifies that the pusher needle support includes a double wedge structure such that pushing a first wedge of the double wedge structure with the arm in a direction parallel to the plane of the guide plate causes a second wedge of the double wedge structure to move in a direction perpendicular to the plane of the guide plate.

Example 50 includes the subject matter of Example 49, and further specifies that the pusher needle support includes a cantilever in contact with the double wedge structure such that the cantilever resists movement of the second wedge of the double wedge structure in the direction perpendicular to the plane of the guide plate.

Example 51 includes the subject matter of Example 50, and further specifies that the pusher needle is mounted on the cantilever.

Example 52 includes the subject matter of any of Examples 39-51, and further specifies that the pusher needle support includes a cantilever, and the pusher needle is mounted on the cantilever.

Example 53 includes the subject matter of any of Examples 39-50, and further specifies that the pusher needle support includes a double wedge structure.

Example 54 includes the subject matter of Example 53, and further specifies that the pusher needle support includes a wedge frame, a first wedge of the double wedge structure is constrained by the wedge frame to move in a direction parallel to the guide plate, and a second wedge of the double wedge structure is constrained by the wedge frame to move in a direction perpendicular to the guide plate.

Example 55 includes the subject matter of any of Examples 39-54, and further specifies that the pusher needle support includes a base plate, and the base plate is on the guide plate.

Example 56 includes the subject matter of Example 55, and further specifies that the base plate has a same material composition as the guide plate.

Example 57 includes the subject matter of any of Examples 38-56, and further specifies that the pusher needle has a cross-sectional area that is less than 2500 square microns.

Example 58 includes the subject matter of any of Examples 38-57, and further includes: one or more probe bodies to contact the probe landing pad and extend through corresponding holes in the guide plate.

Example 59 includes the subject matter of Example 58, and further specifies that the guide plate is a first guide plate, the probe card further includes a second guide plate, and the one or more probe bodies extend through corresponding holes in the second guide plate.

Example 60 includes the subject matter of any of Examples 58-59, and further specifies that individual ones of the probe bodies have a cross-sectional area that is less than 2500 square microns.

Example 61 includes the subject matter of any of Examples 58-60, and further specifies that a spacing between an individual probe body and the pusher needle is less than 100 microns.

Example 62 includes the subject matter of any of Examples 58-61, and further specifies that individual ones of the probe bodies have a length between 4 millimeters and 7 millimeters.

Example 63 includes the subject matter of any of Examples 38-62, and further specifies that the probe landing pad includes a space transformer.

Example 64 includes the subject matter of any of Examples 38-63, and further includes: a circuit board electrically coupled to the probe landing pad.

Example 65 includes the subject matter of any of Examples 38-64, and further specifies that the guide plate includes a plurality of holes, the pusher needle is one of a plurality of pusher needles, individual ones of the pusher needles extend through corresponding holes in the guide plate, and individual ones of the pusher needles are not electrically coupled to the probe landing pad.

Example 66 includes the subject matter of Example 65, and further specifies that the probe card includes four pusher needles.

Example 67 includes the subject matter of any of Examples 38-66, and further specifies that the guide plate is a first guide plate, the probe card further includes a second guide plate, and the pusher needle does not extend through the second guide plate.

The invention claimed is:

1. A probe card, comprising:
   a probe landing pad;
   a guide plate having a hole therein; and
   a pushing mechanism, wherein the pushing mechanism includes a pusher needle and a pusher needle support, the pusher needle support is between the probe landing pad and the guide plate, and the pusher needle support is controllable to cause the pusher needle to extend and retract through the hole in the guide plate.

2. The probe card of claim 1, wherein the guide plate is a first guide plate, the probe card further includes a second guide plate, and the pusher needle support is between the first guide plate and the second guide plate.

3. The probe card of claim 2, wherein a distance between the first guide plate and the second guide plate is between 3 millimeters and 4 millimeters.

4. The probe card of claim 2, wherein the probe card further includes a second guide plate, the first guide plate is between the second guide plate and the pusher needle support, and the pusher needle support is controllable to cause the pusher needle to extend and retract through a hole in the first guide plate and a hole in the second guide plate.

5. The probe card of claim 1, wherein the pusher needle support includes a motor that controllably extends and retracts an arm in a plane parallel to a plane of the guide plate.

6. The probe card of claim 5, wherein the pusher needle support includes a double wedge structure such that pushing a first wedge of the double wedge structure with the arm in a direction parallel to the plane of the guide plate causes a second wedge of the double wedge structure to move in a direction perpendicular to the plane of the guide plate.

7. The probe card of claim 6, wherein the pusher needle support includes a cantilever in contact with the double wedge structure such that the cantilever resists movement of the second wedge of the double wedge structure in the direction perpendicular to the plane of the guide plate.

8. The probe card of claim 1, wherein the pusher needle support includes a cantilever, and the pusher needle is mounted on the cantilever.

9. The probe card of claim 1, wherein the pusher needle support includes a double wedge structure.

10. The probe card of claim 9, wherein the pusher needle support includes a wedge frame, a first wedge of the double wedge structure is constrained by the wedge frame to move in a direction parallel to the guide plate, and a second wedge of the double wedge structure is constrained by the wedge frame to move in a direction perpendicular to the guide plate.

11. The probe card of claim 1, wherein the pusher needle support includes a base plate, the base plate is on the guide plate, and the base plate has a same material composition as the guide plate.

12. The probe card of claim 1, wherein the pusher needle has a cross-sectional area that is less than 2500 square microns.

13. The probe card of claim 1, further comprising:
   one or more probe bodies to contact the probe landing pad and extend through corresponding holes in the guide plate.

14. The probe card of claim 1, wherein the guide plate includes a plurality of holes, the pushing mechanism is one of a plurality of pushing mechanisms, individual ones of the pushing mechanisms include a pusher needle and a pusher needle support, the pusher needle support of an individual pushing mechanism is between the probe landing pad and the guide plate, and the pusher needle support of an individual pushing mechanism is controllable to cause the pusher needle of that individual pushing mechanism to extend and retract through a hole in the guide plate.

15. A method of manufacturing a probe card, comprising:
providing a probe landing pad and a guide plate, wherein the guide plate has a hole therein; and
providing a pushing mechanism between the probe landing pad and the guide plate, wherein the pushing mechanism includes a pusher needle and a pusher needle support, the pusher needle support is between the probe landing pad and the guide plate, and the pusher needle support is controllable to cause the pusher needle to extend and retract through the hole in the guide plate.

16. The method of claim 15, wherein providing the pushing mechanism between the probe landing pad and the guide plate includes:
fabricating the pushing mechanism; and
after fabricating the pushing mechanism, attaching the pushing mechanism to the guide plate.

17. The method of claim 16, wherein the pushing mechanism includes a motor coupled to a base plate, and attaching the pushing mechanism to the guide plate includes attaching the base plate to the guide plate.

18. A method of using a probe card during testing of a unit-under-test (UUT), comprising:
bringing probe bodies of the probe card into electrical contact with conductive contacts of the UUT, wherein the probe bodies extend through holes in a guide plate;
after completion of a test sequence, causing a pusher needle to extend through a hole in the guide plate to contact the UUT as the probe card is moved away from the UUT; and
causing the pusher needle to retract through the hole in the guide plate to not contact the UUT while the probe bodies are in electrical contact with conductive contacts of the UUT.

19. The method of claim 18, wherein the UUT includes a die or a wafer.

20. A probe card, comprising:
a probe landing pad;
a guide plate having a hole therein; and
a pusher needle that extends through the hole, wherein the pusher needle is not electrically coupled to the probe landing pad,
wherein:
the pusher needle is part of a pushing mechanism,
the pushing mechanism includes the pusher needle and a pusher needle support,
the pusher needle support is between the probe landing pad and the guide plate, and
the pusher needle support is controllable to cause the pusher needle to extend and retract through the hole in the guide plate.

21. The probe card of claim 20, wherein the guide plate is a first guide plate, the probe card further includes a second guide plate, and the pusher needle support is between the first guide plate and the second guide plate.

22. The probe card of claim 20, further comprising:
one or more probe bodies to contact the probe landing pad and extend through corresponding holes in the guide plate.

23. The probe card of claim 20, wherein the guide plate is a first guide plate, the probe card further includes a second guide plate, and the pusher needle does not extend through the second guide plate.

* * * * *